US006652708B2

United States Patent
Kneer (10) Patent No.: US 6,652,708 B2
(45) Date of Patent: Nov. 25, 2003

(54) METHODS AND APPARATUS FOR CONDITIONING AND TEMPERATURE CONTROL OF A PROCESSING SURFACE

(75) Inventor: Emil A. Kneer, Tucson, AZ (US)

(73) Assignee: Lam Research Corporation, Fremont, CA (US)

(*) Notice: Subject to any disclaimer, the term of this patent is extended or adjusted under 35 U.S.C. 154(b) by 136 days.

(21) Appl. No.: 10/041,027

(22) Filed: Dec. 28, 2001

(65) Prior Publication Data

US 2003/0124856 A1 Jul. 3, 2003

(51) Int. Cl.$^7$ ............................................. H01L 21/00
(52) U.S. Cl. ............... 156/345.12; 216/88; 156/345.27; 438/692; 438/745
(58) Field of Search .................. 156/345.12, 345.27; 216/38, 88, 89, 91; 438/691, 692, 693, 745

(56) References Cited

U.S. PATENT DOCUMENTS

5,174,881 A    12/1992  Iwasaki et al.

*Primary Examiner*—William A. Powell
(74) *Attorney, Agent, or Firm*—Martine & Penilla, LLP (57) ABSTRACT

Methods and apparatus for controlling the temperature of a process surface and for conditioning of a process surface are provided. In one example, a temperature controller is described within a CMP system. The CMP system has a first roller and a second roller and a linear belt circulating around the first and second rollers. The linear belt has a width that spans between a first edge and a second edge. The temperature controller includes an array of thermal elements. Each of the thermal elements of the array is independently controlled. The array of thermal elements is positioned between the first roller and the second roller and configured to contact a back surface of the linear belt. The array of thermal elements extends between the first edge and the second edge of the linear belt width.

19 Claims, 8 Drawing Sheets

METHODS AND APPARATUS FOR CONDITIONING AND TEMPERATURE CONTROL OF A PROCESSING SURFACE

BACKGROUND OF THE INVENTION

1. Field of the Invention

The present invention relates generally to the fabrication of structures on semiconductor wafers, and more specifically to methods and apparatus of chemical mechanical planarization and to the processing surfaces of chemical mechanical planarization apparatus.

2. Description of the Related Art

In the fabrication of semiconductor devices, integrated circuits are defined on semiconductor wafers by forming a plurality of layers over one another resulting in multi-level structures. As a result of the various layers disposed over one another, a surface topography of the wafer can become irregular, and an un-corrected irregularity increases with subsequent layers. Chemical Mechanical Planarization (CMP) has developed as a fabrication process utilized to planarize the surface of a semiconductor wafer, as well as to perform additional fabrication processes including polishing, buffing, substrate cleaning, etching processes, and the like.

In general, CMP processes involve the holding and rotating of a wafer against a processing surface under a controlled pressure. Typical CMP apparatus include linear belt processing systems in which a belt having a processing surface is supported between two or more drums or rollers which move the belt through a rotary path presenting a flat processing surface against which the wafer is applied. Typically, the wafer is supported and rotated by a wafer carrier, and a polishing platen is configured on the underside of the belt travelling in its circular path. The platen provides a stable surface over which the belt travels, and the wafer is applied to the processing surface of the belt against the stable surface provided by the platen.

Additional CMP apparatus include rotary CMP processing tools having a circular pad configuration for the processing surface, an orbital CMP processing tool similar to the circular CMP processing tool, a sub-aperture CMP processing tool, and other CMP processing systems providing a plurality of apparatus and configurations that, in general, utilize friction to planarize, polish, buff, clean, or otherwise process the surface of a semiconductor wafer having integrated circuits or other structures fabricated thereon.

CMP processing can include the use of varying degrees of abrasives, chemistries, fluids, and the like to maximize effective use of friction for wafer surface preparation, and several apparatus include providing for in-situ rinsing of wafers to reduce or remove the residue of CMP processing, as well as providing for cleaning and conditioning of processing surfaces during processing to maintain controllable and steady state processing.

In order to achieve and maintain controllable and steady state processing, environmental conditions such as, by way of example, temperature, pressure, and state of cleanliness (e.g., particle generation and filtration) are strictly monitored and manipulated to achieve optimum processing conditions. Additional processing variables such as speed of rotation or other movement of the processing surface, speed of rotation of the carrier supporting the wafer, amount of pressure used to apply the wafer to the processing surface, time of processing, and the like are monitored and manipulated as well. In a friction-based processing environment such as CMP, processing temperature significantly impacts removal rate on the surface of the wafer, and consequently, processing time for precise degrees of material removal. By way of example, failure to halt processing at precise points of material removal can result in overpolish, scratching, dishing, and other such defects in the wafer surface and structure fabrication.

Temperature variations on the processing surface vary widely depending on the process and apparatus. By way of example, the processing surface of the linear belt CMP tool is heated by the friction of processing, and by the friction of conditioning pads and pucks employed to condition and activate the belt. Cooling factors include agents used for processing, rinsing agents, and the ambient temperature of the processing environment as the belt travels around the rollers. Temperature variations effect the processing of the semiconductor wafer in general, and effect regions of the same semiconductor wafer differently during processing as some regions travel through more temperature variations than other regions.

Some prior art attempts to maintain processing surface temperature have included the introduction of steam to heat the processing surface to a desired processing temperature, but among other deficiencies, steam fails to address temperature variations across the processing surface. Prior art conditioning methods for linear belt systems include a sweeping conditioning pad travelling across the processing surface, but a sweeping conditioning pad fails to compensate for wave motions in belt systems, and introduces additional temperature variations.

What is needed are methods, processes, and apparatus to manipulate and control the temperature of the processing surface in CMP tools to maintain optimum and controllable processing over the entire surface of the semiconductor wafer.

SUMMARY OF THE INVENTION

Broadly speaking, the present invention fills these needs by providing methods, processes, and apparatus to achieve, maintain, and manipulate the temperature of the processing surface used in CMP processing operations. The present invention can be implemented in numerous ways, including as a process, an apparatus, a system, a device, and a method. Several embodiments of the present invention are described below.

In one embodiment, a temperature controller within a CMP system having a first roller, a second roller, and a linear belt circulating around the first and second rollers is disclosed. The linear belt of the CMP system spans between a first edge and a second edge. The temperature controller includes an array of thermal elements. Each of the thermal elements of the array is independently controlled. The array of thermal elements is positioned between the first roller and the second roller and is configured to contact a back surface of the linear belt. The array of thermal elements extends between the first edge and the second edge of the linear belt width.

In another embodiment, a method for controlling the temperature of a linear belt within a CMP system is disclosed. The CMP system includes a first roller, a second roller, and a linear belt which circulates around the first and second rollers. The linear belt has a width that spans between a first edge and a second edge, and further has an outer processing surface and an inner surface. The method for controlling the temperature of the linear belt includes applying thermal energy to a linear array of locations on the inner surface of the linear belt. The linear array of locations spans from the first edge to the second edge of the width of the linear belt. The method further includes controlling a degree of the applied thermal energy at each of the linear array of locations.

In still a further embodiment, a preparation surface conditioner is disclosed. The preparation surface conditioner is in a CMP system which includes a first roller, a second roller, and a linear belt circulating around the first and second rollers. The linear belt has a width that spans between a first edge and a second edge, and has an inner surface that contacts the first and second rollers and a preparation surface. The preparation surface conditioner includes an array of conditioning pucks for conditioning the outer preparation surface of the linear belt. Each of the conditioning pucks is independently controlled. The array of conditioning pucks extends between the first edge and the second edge of the linear belt width.

In yet another embodiment, a method for conditioning an outer processing surface of a linear belt is disclosed. The outer processing surface of the linear belt is in a CMP system having a first roller and a second roller. The linear belt circulates around the first and second rollers, and has a width that spans between a first and second edge. The linear belt also includes an inner surface. The method for conditioning the outer processing surface of the linear belt includes distributing a plurality of independent conditioning elements along a linear path extending between the first edge and the second edge of the linear belt. The method further includes applying each of the plurality of independent conditioning elements to the outer processing surface along the linear path.

The advantages of the present invention are numerous. One notable benefit and advantage of the invention is that critical edge regions of wafers are subject to fewer defects and processing irregularities by maintaining more precise control and manipulation of the processing surface temperature across the processing surface.

Another benefit is better manufacturing efficiency by reducing the warm up time for a processing tool, reducing or eliminating the requirement for warm up wafer blanks as a tool is brought on line for processing, and therefore greater through-put in wafer processing.

An additional benefit is more precise control of the processing operation thereby facilitating the fabrication of more complex structures, and consistency of fabrication from wafer to wafer or batch of wafers to batch of wafers.

Yet another benefit is longer processing time for individual processing tools, and longer life of processing tool consumables such a processing belts. The improved processing surface conditioning system of the present invention maintain a processing surface for longer periods of time than prior art, and maintain conditioned and activated processing surfaces for longer processing times between maintenance.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for processing surface temperature control and conditioning is disclosed. In preferred embodiments, the processing surface temperature control includes individual heating elements spanning the processing surface to control, manipulate, and maintain a desired processing surface temperature profile. Processing surface conditioning is provided by an array of conditioning pucks and associated rinse and thistle brush units for effective, controllable, and complete processing surface conditioning and maintenance. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
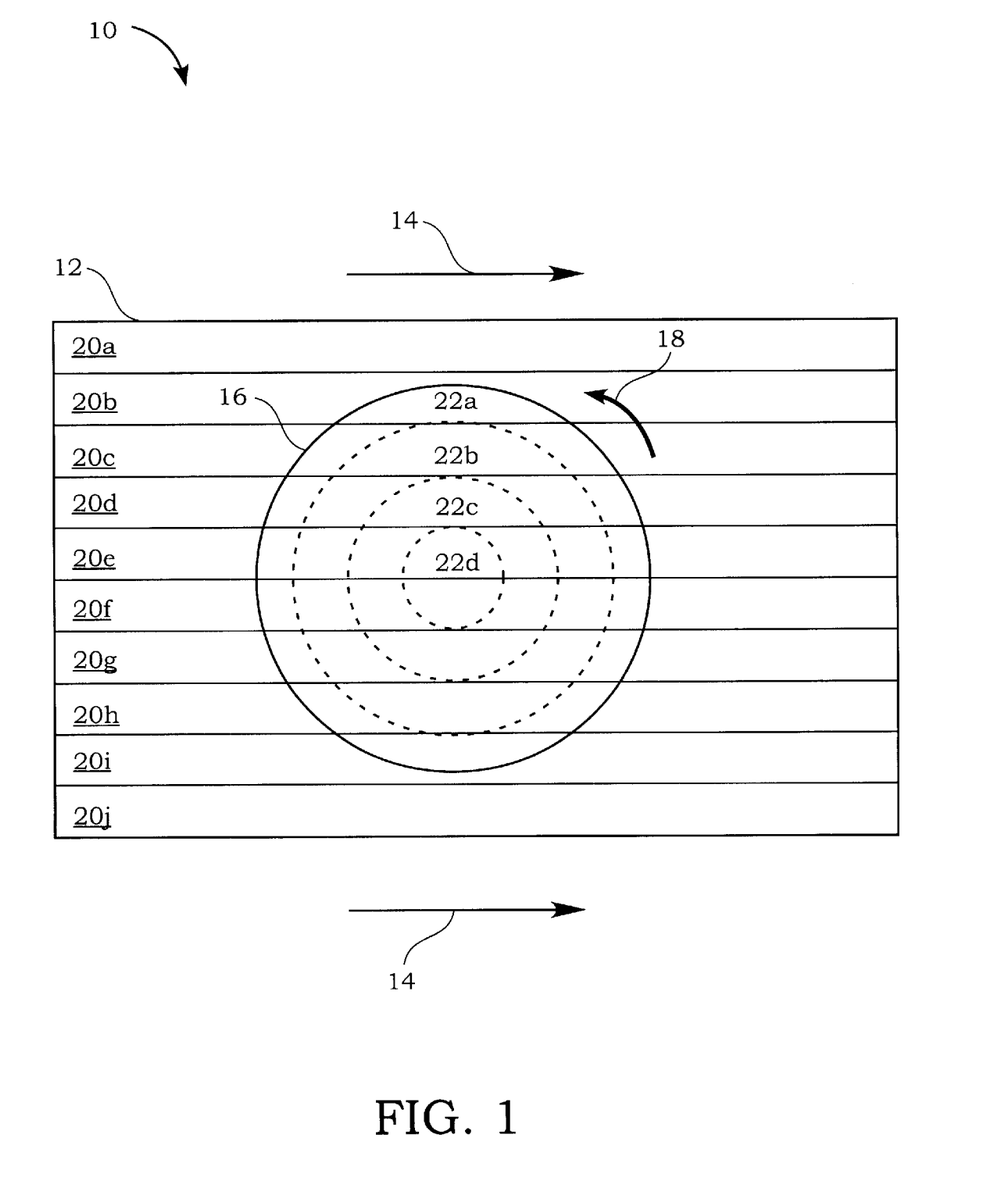
FIG. 1 shows a liner belt processing surface of a typical CMP processing system.

FIG. 1 shows a liner belt processing surface 10 of a typical CMP processing system. Processing belt 12 includes rigid and flexible processing belts 12 travelling around rollers (not shown) in direction 14. A wafer 16 is typically applied to a center region of processing belt 12 with a pressure and rotated in, by way of example, direction 18. In FIG. 1, processing belt 12 is shown divided into ten zones 20a–20j across the surface of processing belt 12, and wafer 16 is shown divided into four regions 22a–22d from the edge region 22a of the wafer 16 to the center region 22d of the wafer 16. The processing zones 20a–20j and the wafer regions 22a–22d are exemplary only, and may be represented by more or fewer zones and regions in other processing configurations, processing apparatus, semiconductor wafer sizes, and the like.

As wafer 16 is rotated in direction 18, wafer regions 22a–22d rotate through a plurality of processing belt zones 20a–20j. As can be appreciated from FIG. 1, edge region 22a travels through more processing belt zones 20a–20j than center region 22d. As center region travels through processing belt zones 20e and 20f, edge region 22a travels through processing belt zones 20b, 20c, 20d, 20e, 20f, 20g, 20h, and 20i. The center processing belt zones 20e and 20f contact greater than three times the wafer surface area than do processing belt zones 20b and 20i. Further, temperature variations across processing belt zones 20a–20j have a much more significant impact on wafer edge region 22a travelling through a greater number of processing belt zones 20b–20i than on wafer center region 22d travelling though belt processing zones 20e and 20f.

One embodiment of the present invention addresses at least two aspects of temperature control of the processing surface. During a warm up phase of a processing tool, a relatively cool processing surface is rotated or otherwise caused to move, and relatively cool processing slurries, chemistries, or other processing fluids are introduced into the processing environment. As initial wafers to be processed are applied to the processing surface, frictional contact begins to warm the processing surface. As can be appreciated from FIG. 1, center processing zones 20e and 20f will warm faster than outer processing zones 20a–20d and 20g–20j due to the larger surface area of the wafer 16 engaged in frictional contact. Temperature variations, therefore, begin with initial processing, and temperature variations remain across the surface of the processing belt 12 through the run time of the processing tool. Edge region 22a generates the least amount of temperature gain in belt processing zones 20b and 20c due to the smallest surface area in contact with the processing belt 12 in those zones, and edge region 22a travels through the greatest amount of temperature variation crossing through the most zones.

Figure 2A:
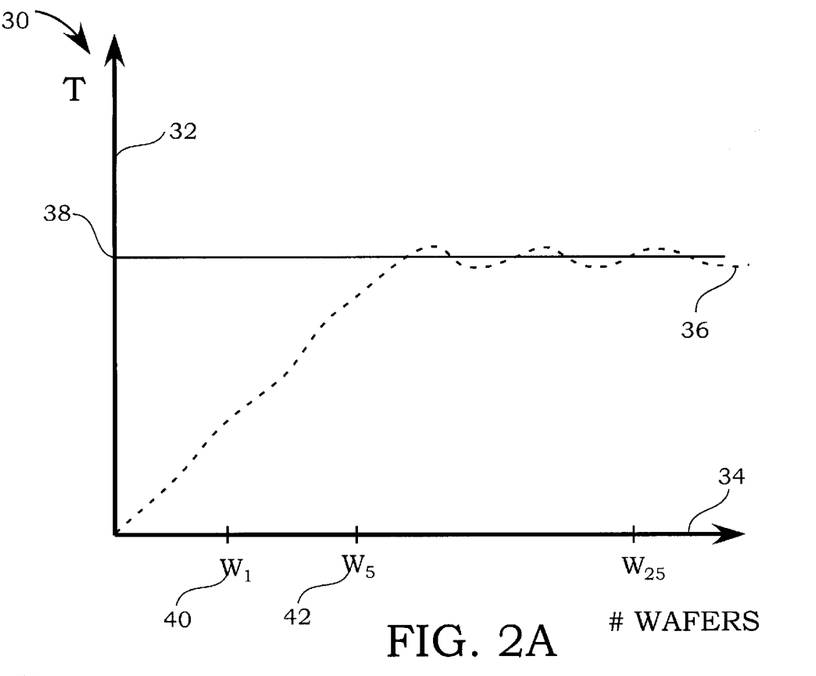
FIG. 2A shows a graph of temperature versus number of wafers representing an average temperature of the processing surface at initial warm up of a processing tool.

FIG. 2A shows a graph 30 of temperature 32 versus number of wafers 34 representing an average temperature of the processing surface at initial warm up of a processing tool. Graph 30 illustrates an exemplary average processing surface temperature 36, and does not reflect temperature variations across identified processing zones (see FIG. 1). In FIG. 2A, average processing temperature 36 shows a steady, non-linear rise through a first wafer 40, continuing to rise to a desired processing temperature 38, reaching the desired processing temperature 38 at approximately the fifth wafer 42. The average processing temperature 36 then remains at approximately the desired processing temperature 38.

Figure 2B:
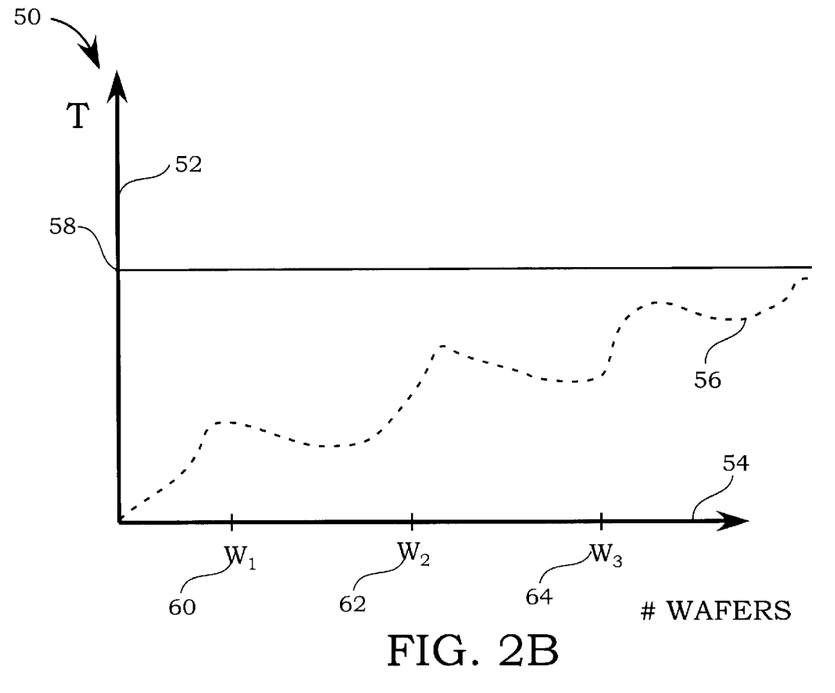
FIG. 2B shows a more detailed graph of the non-linear temperature rise during the initial wafers processed.

The initial temperature rise is non-linear, and as can be seen in FIG. 2A, the average processing temperature 36 fluctuates even after the desired processing temperature 38 is attained. Factors such as slurry or other processing chemistry introduction will initially lower the average processing temperature, which is reflected in the temperature fluctuation after attaining desired processing temperature 38. FIG. 2B shows a more detailed graph 50 of the non-linear temperature rise during the initial wafers processed.

Graph 50 plots temperature 52 versus number of wafers 54 as in FIG. 2A. Average processing temperature 56 is shown to rise through the first wafer 60, and then drop before rising again through the second wafer 62. Similarly, the average processing temperature 56 then drops again prior to the third wafer 64, and rises steadily through the third wafer 56, falls prior to succeeding wafers, and continues the rise and fall profile until reaching desired processing temperature 58.

Typical processing operations account for the rise and fall of the average processing temperature 56 during the initial wafers processed, as well as the constant fluctuation after achieving a desired processing temperature 58. At the completion of processing, a wafer is withdrawn from the processing surface, which removes the frictional generation of heat. When a next wafer is applied to the processing surface, frictional generation of heat is reflected in the corresponding temperature rise. Additionally, in some processing configurations, an in-situ post-processing rinse is applied to the wafer surface, and the rinsing fluid serves to cool the processing surface. Typically, because the temperature fluctuation is so drastic during the initial warm up of a processing tool, a consistent and precise processing of a wafer is essentially impossible to achieve, and therefore wafer blanks, also known as dummy wafers, are processed through as the first few wafers until more acceptable processing conditions are achieved. As illustrated, however, only the average processing temperature is attained, and temperature variations remain across the plurality of processing zones (see FIG. 1) of the processing surface.

Figure 3A:
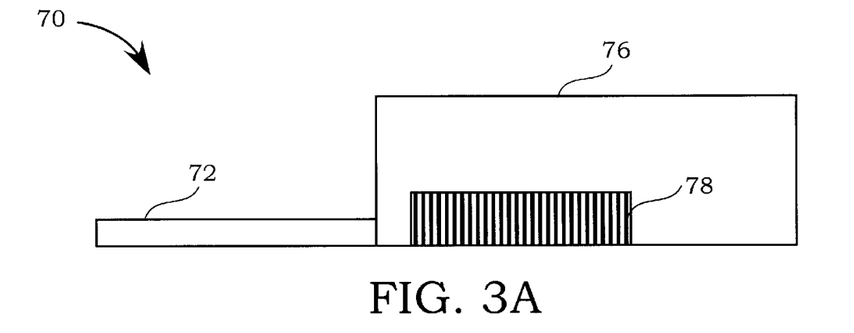
FIG. 3A illustrates a side view of a backside heating unit in accordance with one embodiment of the present invention.

FIG. 3A illustrates a side view of a backside heating unit 70 in accordance with one embodiment of the present invention. Backside heating unit 70 is configured with a conditioner support plate 72, a heating element housing 76, and a plurality of individually controllable heating elements 78 contained within the heating element housing 76. As used herein, heating elements are units that impart thermal energy to increase, decrease, or maintain a measured temperature. In one embodiment of the invention, backside heating unit 70 is positioned along the backside, also referred to as an underside, of processing belt 12 (see FIG. 1) to provide individually controllable heating elements 78 across processing belt 12 (see FIG. 1) for temperature control and management of the plurality of processing zones 20a–20j shown in FIG. 1.

Figure 3B:
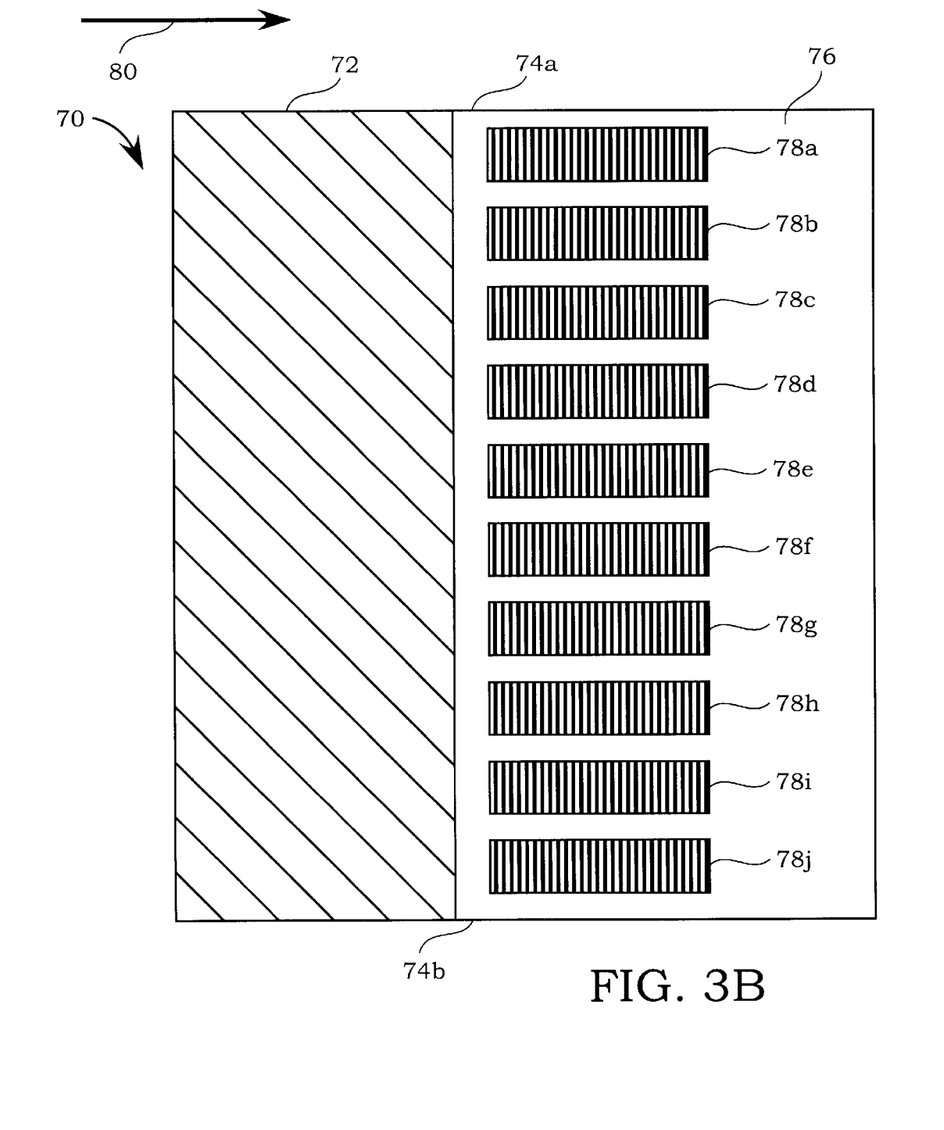
FIG. 3B shows a top view of the backside heating unit shown in FIG. 3A in accordance with one embodiment of the invention.

FIG. 3B shows a top view of the backside heating unit 70 shown in FIG. 3A in accordance with one embodiment of the invention. Backside heating unit 70 spans the width of processing belt 12 (see FIG. 1) from a region of a first edge of processing belt 74a to a region of a second edge of processing belt 74b with the heating element housing 76 having individually controllable heating elements 78a–78j contained therein. In one embodiment, conditioner support plate 72 is attached to the heating element housing 76. Conditioner support plate 72 is described in greater detail below in reference to FIGS. 5B and 6.

As illustrated in FIGS. 3A and 3B, one embodiment of the present invention includes individually controllable thermal elements 78a–78j embedded in heating element housing 76, which spans processing belt 12 (see FIG. 1). In one embodiment, individually controllable heating elements 78a–78j are mounted in an epoxy or similar medium in the heating element housing 76 such that individually controllable heating elements 78a–78j have an exposed surface level with the surface of heating element housing 76. Backside heating unit 70 is positioned adjacent to the underside of the processing belt 12 (see FIG. 1) so that the backside of the processing belt 12 (see FIG. 1) travels over the exposed surfaces of the individually controllable heating elements 78a–78j. Thermal transfer is then accomplished from the individually controllable heating elements to the processing zones 20a–20j (see FIG. 1) by conduction. In the illustrated embodiment, ten individually controllable heating elements 78a–78j are shown to correspond to the ten processing zones 20a–20j illustrated in FIG. 1. In other embodiments, more or fewer individually controllable heating elements 78a–78j can be configured in accordance with measured and calibrated processing zones 20a–20j (see FIG. 1) of specific processing surfaces. The illustrated embodiments are exemplary of a plurality of processing zones. Additionally, it should be appreciated that individually controllable heating elements 78a–78j are controlled by a system controller (not shown) providing for the monitoring, management and control of each of the individually controllable heating elements 78a–78j.

Returning to FIGS. 3A and 3B, belt travel 80 is shown (common to both FIGS. 3A and 3B) traveling across conditioner support plate 72 and heating element housing 76 having individually controllable heating elements 78a–78j embedded therein. In typical processing tools, processing belts 12 (see FIG. 1) travel at a belt speed ranging from 50 feet per minute up to 400 feet per minute, and processing belts 12 (see FIG. 1) are constructed of a variety of materials including steel, alloys, and urethane. In one embodiment of the present invention, individually controllable heating elements 78a–78j are calibrated according to the material used for specific processing belts 12 (see FIG. 1), as well as the processing belt 12 (see FIG. 1) speed of rotation during processing. In one embodiment, a desired time to raise the processing surface to the desired processing temperature in all identified processing zones, e.g., 20a–20j (see FIG. 1) is 20 seconds, but the actual time may be adjusted according to noted processing variables. In one embodiment, processing variables such as composition of processing belt 12 (see FIG. 1), speed of rotation of processing belt (see FIG. 1), and type of process (e.g., metal CMP, dielectric CMP, barrier removal, polish, buff, clean, and the like), and other variables are pre-calibrated to enable system controller (not shown) for the individually controllable heating elements 78a–78j to manipulate and otherwise manage the applied temperature for each of the individually controllable heating elements 78a–78j to achieve desired processing temperature across the processing surface as rapidly as possible, and to maintain the temperature for the duration of processing.

Figure 4:
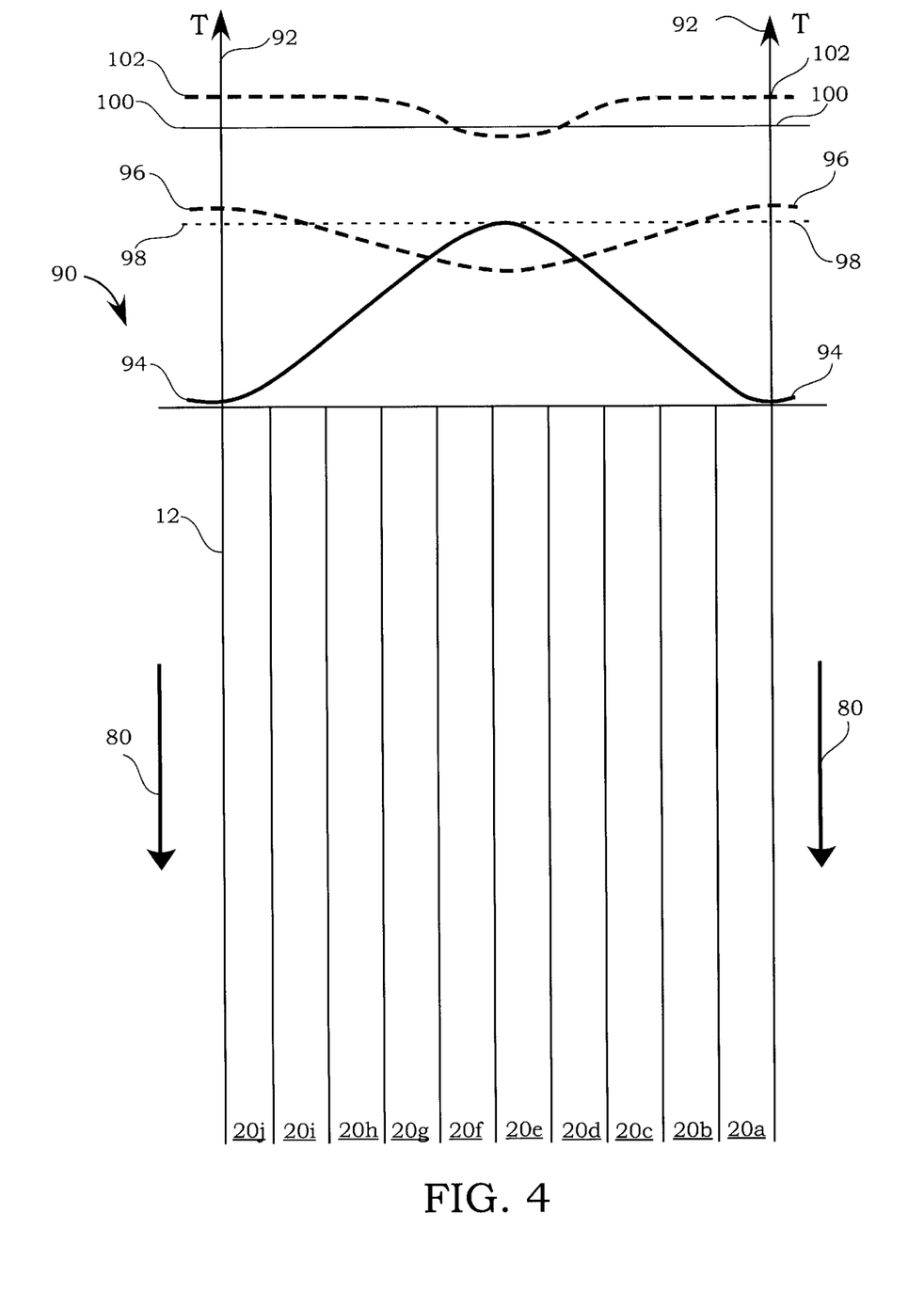
FIG. 4 shows a plot of temperature across processing zones of a processing belt in accordance with an embodiment of the present invention.

FIG. 4 shows a plot 90 of temperature across processing zones 20a–20j of processing belt 12 in accordance with an embodiment of the present invention. Plot 90 shows temperature 92 achieved in each of the processing zones 20a–20j resulting from thermal energy generated through the frictional contact of wafer processing 94 and the thermal energy applied through individually controllable heating elements 78a–78j (see FIG. 3B. As illustrated in FIG. 4, the thermal energy generated through frictional contact of wafer processing 94 is negligible in the outer processing zones (e.g., 20a, 20b, 20i, and 20j), and rises substantially in the inner processing zones (e.g., 20e, 20f), corresponding to the greatest amount of surface area of a wafer in frictional contact with the processing surface at the center of the processing belt 12 as described in reference to FIG. 1. Line 96 represents the applied thermal energy from the individually controllable heating elements 78a–78j (see FIG. 3B) in accordance with one embodiment of the invention. As can be appreciated, a greater amount of thermal energy is applied in outer processing zones (e.g., 20a, 20b, 20i, and 20j), and a lesser amount of thermal energy applied in the inner processing zones (e.g., 20e, 20f). The resulting effective temperature 98 reflects the temperature in each of the processing zones 20a–20j, and not an average temperature across the processing surface.

In one embodiment of the invention, a higher or lower temperature than what is generated by frictional contact is desired for specific processing operations. The temperature generated by frictional contact in accordance with specific processes and processing materials is known and shown in FIG. 4 at 94. In one embodiment, a higher processing temperature is desired. Line 102 shows a theoretical applied thermal energy by each of the individually controllable heating elements 78a–78j (see FIG. 3A) to achieve effective processing temperature shown at line 100. Similarly, a plot (not shown) can be generated to illustrate the required applied thermal energy to achieve a lower effective processing temperature. In such an embodiment, a peltier or similar cooling element can be implemented for process surface cooling.

In general, an increase in processing temperature will increase the removal rate of material from a substrate surface, and in some applications, increased removal rate is desirable for increased through put. However, in some applications, precision of removal is of paramount consideration, and therefore an overall decrease in processing temperature is the desired goal. In accordance with one embodiment of the invention, both an increase in processing temperature over that produced by frictional contact, and a decrease in processing temperature from that produced by frictional contact can be established and maintained by manipulation and management of the thermal energy applied by each of the individually controllable heating elements 78a–78j. Additionally, one embodiment of the present invention provides for essentially equal thermal distribution across the processing surface, and essentially eliminating the thermal variations described above in reference to FIG. 1. In one embodiment, essentially eliminating the thermal variations is particularly useful in the efficient use of an entire wafer surface for structure fabrication, and in particular the critical edge regions. Equal thermal distribution increases consistency and controllability of the process across the wafer surface, thereby increasing the stability of wafer processing.

In one embodiment of the invention, use of the individually controllable heating elements 78a–78j (see FIG. 3B) is configurable to compensate for such variations as process surface cooling in between wafers, during application of processing slurries or other agents, wafer rinsing, and the like. By way of example, in a copper CMP operation, a post-processing of the wafer typically is accomplished in-situ prior to wafer removal. The post-polish rinse can cool the processing surface significantly, as much 20% in some applications. One embodiment of the present invention is calibrated and implemented according to wafer processing cycle for particular processing operations to compensate for process surface cooling in such circumstances. As can be appreciated, compensation for process surface cooling in between wafers, during introduction of processing slurries or other agents, during post-processing cleaning, and the like can substantially reduce or eliminate the processing temperature fluctuations, and the temperature rise and fall illustrated and described above in reference to FIGS. 2A and 2B. The reduction or elimination of such temperature variations, particularly during processing tool warm up, can reduce or eliminate the blank wafers used for tool warm up, and increase manufacturing efficiency and through put.

Figure 5A:
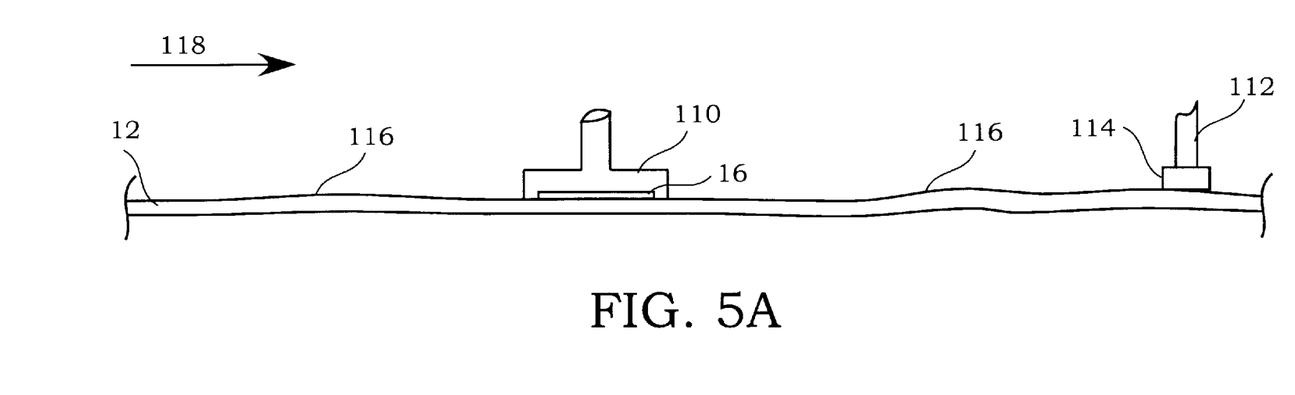
FIG. 5A shows a typical belt conditioning configuration.

As described above, one contributing factor to temperature variation across the processing surface is thermal energy generated by the frictional contact of a belt or pad conditioner sweeping across the processing surface. In typical prior art processing configurations, a conditioning puck sweeps across the processing surface scraping excess processing residue and providing some process surface activation. FIG. 5A shows a typical belt conditioning configuration. Process belt 12 travelling in direction 118 passes under wafer carrier 110 holding wafer 16 against the processing surface. For clarity of illustration, a platen is not illustrated, but would typically be positioned directly underneath the wafer 16 and wafer carrier 110 on the opposite side of processing belt 12.

Also shown in FIG. 5A is a conditioning pad 114 attached to a conditioning pad carrier 112. In typical configurations, the conditioning pad 112 carrier sweeps the conditioning pad 114 across the processing belt 12 during wafer processing, generally moving from one edge of the processing belt 12, across the processing belt 12 to the other edge of the processing belt 12, and back again in a continuous cycle for the duration of wafer processing. In addition to providing limited processing surface conditioning, the frictional contact that generates thermal energy to the processing surface, sweeps from one edge to the other and back again, creating a moving temperature variation on the processing surface. Additionally, the typical size of the conditioning pad 114 makes it particularly susceptible to ineffectiveness, or intermittent ineffectiveness, due to wave effects on the processing belt 12. As the processing belt 12 travels between rollers (not shown) a wave effect is generated whereby the rotational motion of the belt creates dips and swells that travel with the belt, resembling wave motion. In FIG. 5A, points 116 illustrate wave motion in a processing belt 12. As a wave approaches and contacts the conditioning pad 114, the processing surface can bind against the conditioning pad, and then drop completely away from the surface of the conditioning pad, resulting in ineffective conditioning, and inconsistent application of thermal energy through frictional contact.

Figure 5B:
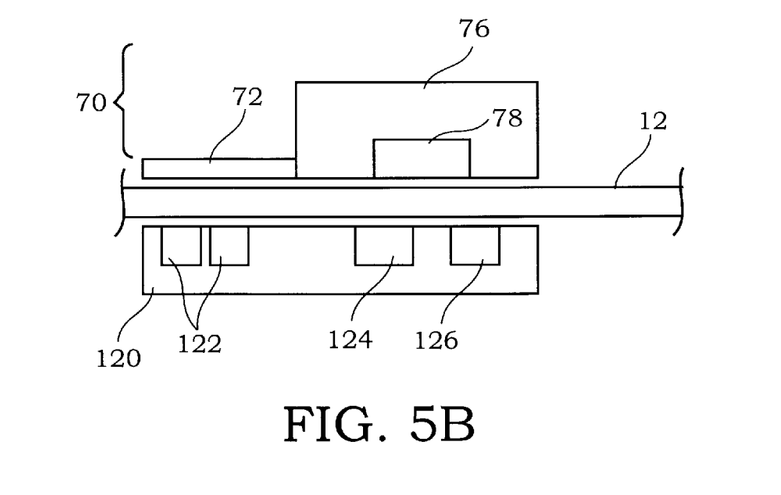
FIG. 5B shows a side view of a conditioning pad unit in accordance with one embodiment of the present invention.

In one embodiment of the present invention, processing surface conditioning is combined with processing surface temperature control for more effective and efficient CMP processing. FIG. 5B shows a side view of a conditioning pad unit 120 in accordance with one embodiment of the present invention. As illustrated in FIG. 5B, conditioning pad unit 120 includes conditioning pucks 122, exit spray and puck rinse 124, and thistle brush exit 126. In one embodiment of the invention, conditioning pad unit 120 is mounted on an opposite side of processing belt 12 from, and directly opposing, backside heating unit 70. Conditioning pad unit 120 is therefore positioned adjacent to and against the processing surface of processing belt 12.

In accordance with one embodiment of the invention, conditioning pucks 122 are positioned in opposition to conditioner support plate 72. Conditioning pucks are configured to apply pressure against the processing belt 12 when conditioning, and conditioner support plate 72 is positioned to provide a support against which consistent and controllable force can be applied. In order to minimize any wave effect on the processing belt 12, and to efficiently utilize support hardware for the conditioning pucks 122, conditioning pad unit 120 also includes exit spray and puck rinse 124 which is configured, in one embodiment, to rinse the processing surface of any residue loosened by conditioning pucks 122, as well as to rinse the conditioning pucks 122 to prevent residue build-up which would render the conditioning pucks 122 ineffective. Additionally, thistle brush exit 126 provides a final scraping and activation of processing surface after conditioning and rinsing.

Figure 6:
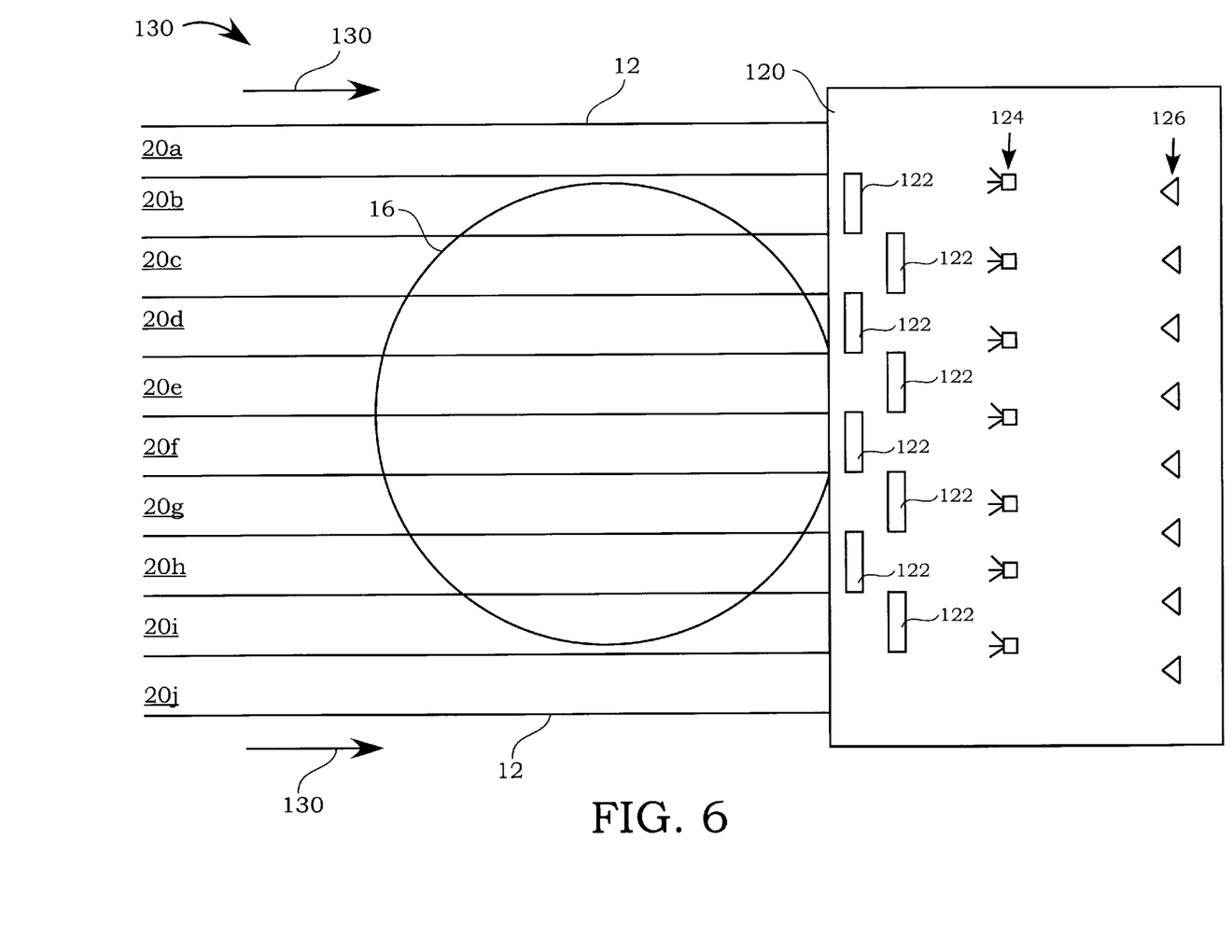
FIG. 6 shows a top view of a linear belt processing system with a conditioning pad unit configured thereto.

FIG. 6 shows a top view of a linear belt processing system 130 with a conditioning pad unit 120 configured thereto. Wafer 16 is shown on processing belt 12, with processing belt 12 travelling in direction 130. Processing zones 20a–20j are shown for reference. In one embodiment of the invention, conditioning pad unit 120 includes a plurality of conditioning pucks 122 configured in a checkerboard pattern to ensure full and complete conditioning of processing surface. In one embodiment, the checkerboard pattern essentially spans the processing belt 12 as a linear array of conditioning pucks 122. A plurality of exit spray and puck rinse units 124 are shown following (in the direction of processing belt travel 130) the plurality of conditioning pucks 122, and a plurality of thistle brushes 126 provide for the final scraping and surface activation of the processing surface. In one embodiment, individual conditioning pucks 122 are pressure controlled to be precisely implemented according to process operations and processing agents used. In one embodiment, each conditioning puck 122 is pressure controlled in a range of about 0.1 PSI to about and greater than 2.0 PSI. It should be noted that individual pressure control provides for superior processing surface conditioning that can be adjusted and modified as desired or processing conditions dictate. As can be appreciated from FIG. 6, center processing zones (e.g., 20e, 20f) may require more or less pressure and/or processing surface conditioning due to larger surface area of wafer 12 in contact with the processing surface. Outer processing zones (e.g., 20a–20c, 20h–20j) have a lesser or substantially no contact with surface area of wafer 12, and therefore result in differing process surface conditioning requirements. In one embodiment of the invention, the differing processing surface conditioning requirements through processing zones 20a–20j are effectively managed with the complete coverage provided by conditioning pucks 122 in the checkerboard pattern across the processing surface, as well as the individually controllable pressures for each of the conditioning pucks 122.

In one embodiment of the invention, exit spray and puck rinse units 124 are supplied by a rinsing or cleaning agent supply (not shown), and are individually controllable for a range of spray volumes dispensed. In some processing operations, the increased surface area of the wafer 12 in contact with the processing surface in center processing zones (e.g., 20e, 20f) modify processing surface conditioning and cleaning requirements and modifying the spray volume of the corresponding exit spray and puck rinse unit 124 provides the most effective and stable cleaning of the processing surface. In one embodiment of the invention, each exit spray and puck rinse unit 124 is controllable through a range of volume dispensed and a pressure of spray dispensed.

Figure 7:
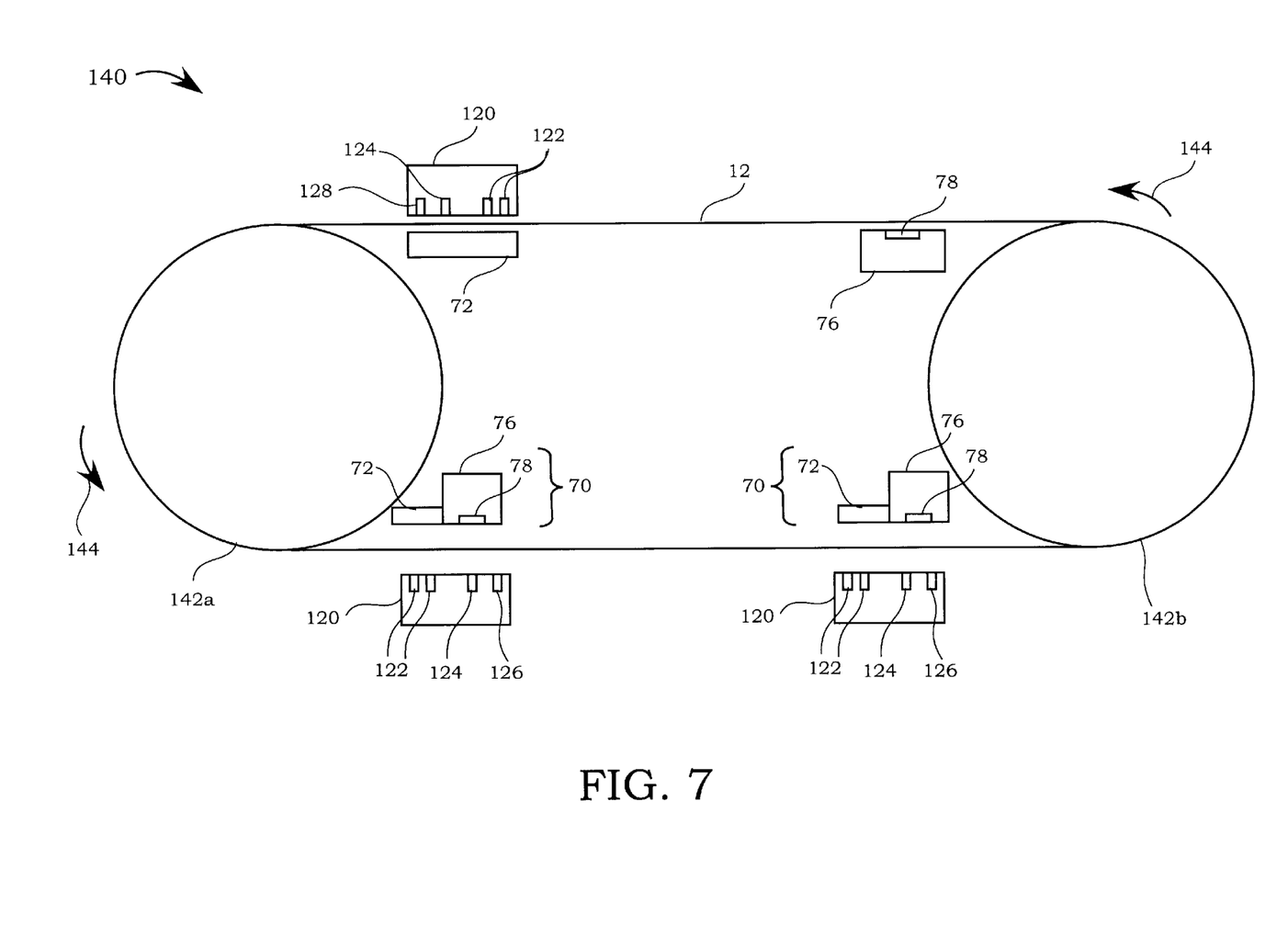
FIG. 7 shows a CMP linear belt processing system with backside heating units and conditioning pad units configured in accordance with several embodiments of the present invention.

FIG. 7 shows a CMP linear belt processing system 140 with backside heating units 70 and conditioning pad units 120 configured in accordance with several embodiments of the present invention. As shown in FIG. 7, processing belt 12 is mounted on and around rollers 142a and 142b. Direction of rotation of processing belt 12 is shown by arrows 144. Backside heating unit 70 and conditioning pad unit 120 can be positioned in a plurality of locations and configurations in accordance with embodiments of the invention. In FIG. 7, two positional embodiments are illustrated. With belt rotation in direction 144 as shown, the processing surface in one embodiment would travel across the conditioning pucks 122 prior to traversing exit spray and puck rinse 124, and thistle brush exit 126. Therefore, the backside heating unit 70 is positioned such that the conditioner support plate 72 is opposite the conditioning pucks 122 in order to provide the required support. The conditioning pad unit 120 and the backside heating element 70 are positioned in two different locations in the bottom region of the CMP linear belt processing system 140 shown in FIG. 7, and configured as described above.

In the top region of the CMP linear belt processing system 140, individual components of the backside heating unit 70 and the conditioning pad unit 120 are configured in accordance with another embodiment of the invention. In the illustrated embodiment, the heating element housing 76 having the plurality of individual heating elements 78 contained therein is positioned just prior to the processing region on the CMP linear belt processing system 140. Temperature control and manipulation is effected just prior to processing in this embodiment. Conditioner support plate 72 and conditioning pad unit 120 are positioned on opposite sides of processing belt 12 immediately following the processing region on the CMP linear belt processing system 140. In this manner, it is illustrated that individual components of the described backside heating unit 70, and the conditioning pad unit 120 can be positioned and implemented in accordance with processing desires and conditions.

Figure 8:
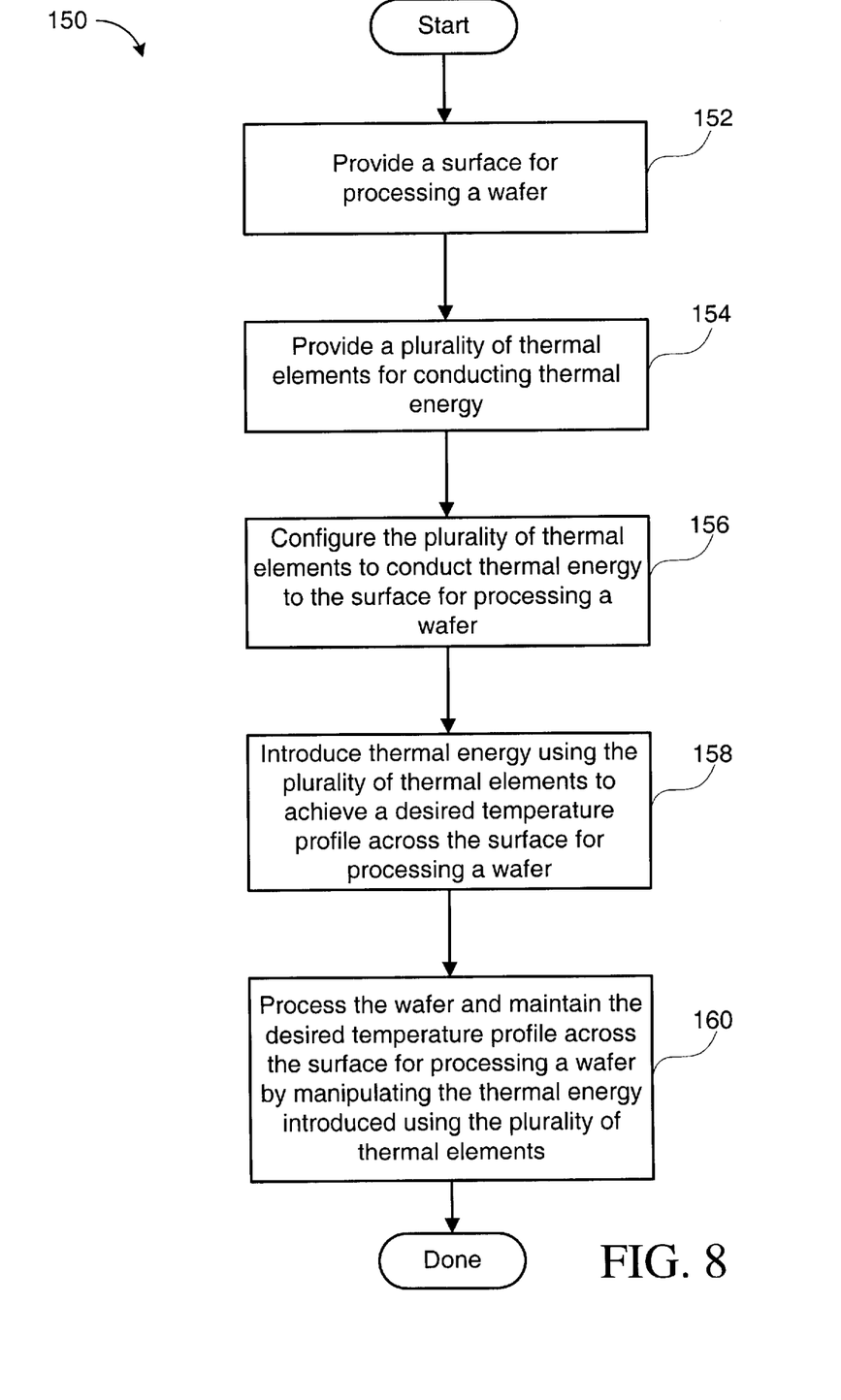
FIG. 8 is a flow chart diagram illustrating the method operations for processing surface temperature control in accordance with one embodiment of the present invention.

FIG. 8 is a flow chart diagram 150 illustrating the method operations for processing surface temperature control in accordance with one embodiment of the present invention. The method begins with operation 152 in which a processing surface for processing a wafer is provided. In one embodiment, the processing surface is a linear belt used in CMP processing of wafers.

The method continues with operation 154 in which a plurality of thermal elements are provided for conducting thermal energy. In one embodiment, the plurality of thermal elements is configured in an array spanning the process surface. In one embodiment, the process surface is a linear belt used in CMP processing, and the array of thermal units spans the linear belt from one edge of the belt to the other edge of the linear belt.

Next, in operation 156, the method configures the plurality of thermal units to conduct thermal energy to the surface for processing a wafer. In one embodiment of the invention, the plurality of thermal units are contained in a heating element housing configured to house each of the plurality of thermal units in an array configuration that will span the processing surface. In one embodiment, each one of the plurality of thermal units is mounted in epoxy or other such medium so that the body of each thermal unit is within the heating element housing, and a thermal energy transfer surface is exposed and level with the surface of the heating element housing. The heating element housing with embedded thermal units, each with an exposed thermal energy transfer surface, is then positioned to span the processing surface across a back side of the processing surface. Thermal energy imparted by each of the thermal units is then transferred to the back side of the processing surface and thereby imparting thermal energy to heat or to cool the processing surface.

The method continues with operation 158 in which thermal introduced using the plurality of thermal elements to achieve a desired temperature profile across the surface for processing a wafer. In one embodiment, the processing surface is divided into a plurality of processing zones, and each zone has an identifiable temperature profile. Thermal energy is introduced using thermal elements to precisely control and maintain a desired temperature in each of the processing zones, and thereby achieving a desired temperature profile across the surface for processing a wafer. In one embodiment, thermal energy is applied to raise the temperature of a processing zone. In one embodiment, thermal energy is manipulated to lower the temperature of a processing zone. In one embodiment, thermal energy is manipulated or managed to raise, lower, or some combination thereof, the temperature of the plurality of processing zones.

The method concludes with operation 160 in which the wafer is processed and the desired temperature profile across the surface for processing a wafer is maintained by manipulating the thermal energy introduced using the plurality of thermal elements. In one embodiment, the surface for processing a wafer is monitored in each of the plurality of processing zones, and thermal energy is manipulated using each thermal unit of the plurality of thermal units to raise or lower the temperature of each processing zone to maintain the desired temperature profile across the surface for processing a wafer. In one embodiment, the desired temperature profile is maintained for the duration of wafer processing for the processing tool, and the method is done.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. In a chemical mechanical planarization (CMP) system, the CMP system having a first roller, a second roller, and a linear belt, the linear belt circulating around the first roller and the second roller, the linear belt having a width that spans between a first edge and a second edge, a temperature controller, comprising:

an array of thermal elements, each of the thermal elements of the array being independently controlled, the array of thermal elements being positioned between the first roller and the second roller and configured to contact a back surface of the linear belt, the array of thermal elements extending between the first edge and the second edge of the linear belt width.

2. In a chemical mechanical planarization (CMP) system, the CMP system having a first roller, a second roller, and a linear belt, the linear belt circulating around the first roller and the second roller, the linear belt having a width that spans between a first edge and a second edge, the temperature controller as recited in claim 1, wherein each of the thermal elements of the array is connected to a system controller, the system controller being configured to manage a processing surface temperature of the linear belt.

3. In a chemical mechanical planarization (CMP) system, the CMP system having a first roller, a second roller, and a linear belt, the linear belt circulating around the first roller and the second roller, the linear belt having a width that spans between a first edge and a second edge, the temperature controller as recited in claim 1, wherein the linear belt includes a plurality of processing zones across a processing surface, and wherein each of the thermal elements of the array of thermal elements corresponds to a processing zone, the thermal elements of the array being independently controlled to manipulate a processing temperature of the processing zone corresponding to the thermal element.

4. In a chemical mechanical planarization (CMP) system, the CMP system having a first roller, a second roller, and a linear belt, the linear belt circulating around the first roller and the second roller, the linear belt having a width that spans between a first edge and a second edge, the temperature controller as recited in claim 3, wherein each of the thermal elements of the array of thermal elements is configured to apply thermal energy to the processing zone corresponding the thermal element to raise the processing temperature of the processing zone corresponding the thermal element.

5. In a chemical mechanical planarization (CMP) system, the CMP system having a first roller, a second roller, and a linear belt, the linear belt circulating around the first roller and the second roller, the linear belt having a width that spans between a first edge and a second edge, the temperature controller as recited in claim 3, wherein each of the thermal elements of the array of thermal elements is configured to apply thermal energy to the processing zone corresponding to the thermal element to lower the processing temperature of the processing zone corresponding the thermal element.

6. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, a method for controlling the temperature of the linear belt, comprising:

applying thermal energy to a linear array of locations on the inner surface of the linear belt, the linear array of locations spanning from the first edge to the second edge of the width of the linear belt; and controlling a degree of the applied thermal energy at each of the linear array of locations.

7. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for controlling the temperature of the linear belt as recited in claim 6, wherein each location of the linear array of locations includes a thermal unit, the thermal unit being configured to apply thermal energy to the inner surface of the linear belt.

8. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for controlling the temperature of the linear belt as recited in claim 7, wherein each thermal unit is connected to a processing surface temperature controller, the processing surface temperature controller being configured to control the application of thermal energy by each thermal unit in order to maintain a desired processing surface temperature.

9. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for controlling the temperature of the linear belt as recited in claim 8, wherein each location of the linear array of locations corresponds to a processing zone of the outer processing surface of the linear belt, and wherein each a thermal unit is configured to apply thermal energy to the inner surface of the linear belt to control a processing temperature of the processing zone of the outer processing surface of the linear belt.

10. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for controlling the temperature of the linear belt as recited in claim 9, wherein each thermal unit is configured to apply thermal energy to the inner surface of the linear belt to increase the temperature of the processing zone of the outer processing surface of the linear belt.

11. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for controlling the temperature of the linear belt as recited in claim 9, wherein each thermal unit is configured to apply thermal energy to the inner surface of the linear belt to decrease the temperature of the processing zone of the outer processing surface of the linear belt.

12. In a chemical mechanical planarization (CMP) system, the CMP system having a first roller, a second roller, and a linear belt, the linear belt circulating around the first roller and the second roller, the linear belt having a width that spans between a first edge and a second edge, the linear belt further having an outer preparation surface and an inner surface that contacts the first roller and the second roller, a preparation surface conditioner, comprising:

an array of conditioning pucks for conditioning the outer preparation surface of the linear belt, each of the conditioning pucks of the array being independently controlled, the array of conditioning pucks extending between the first edge and the second edge of the linear belt width.

13. In a chemical mechanical planarization (CMP) system, the CMP system having a first roller, a second roller, and a linear belt, the linear belt circulating around the first roller and the second roller, the linear belt having a width that spans between a first edge and a second edge, the linear belt further having an outer preparation surface and an inner surface that contacts the first roller and the second roller, the preparation surface conditioner as recited in claim 12, further comprising:

an array of spray nozzles for rinsing the outer preparation surface of the linear belt and the conditioning pucks, each of the spray nozzles of the array being independently controlled, the array of spray nozzles extending between the first edge and the second edge of the linear belt width.

14. In a chemical mechanical planarization (CMP) system, the CMP system having a first roller, a second roller, and a linear belt, the linear belt circulating around the first roller and the second roller, the linear belt having a width that spans between a first edge and a second edge, the linear belt further having an outer preparation surface and an inner surface that contacts the first roller and the second roller, the preparation surface conditioner as recited in claim 13, further comprising:

an array of thistle brushes configured to sweep the outer preparation surface of the linear belt, the array of thistle brushes extending between the first edge and the second edge of the linear belt width.

15. In a chemical mechanical planarization (CMP) system, the CMP system having a first roller, a second roller, and a linear belt, the linear belt circulating around the first roller and the second roller, the linear belt having a width that spans between a first edge and a second edge, the linear belt further having an outer preparation surface and an inner surface that contacts the first roller and the second roller, the preparation surface conditioner as recited in claim 12, wherein each of the conditioning pucks of the array being independently controlled is configurable to apply a pressure against the outer preparation surface from about 0.1 PSI to about 2.0 PSI.

16. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, a method for conditioning the outer processing surface of the linear belt, comprising:

- distributing a plurality of independent conditioning elements along a linear path extending between the first edge and the second edge of the linear belt; and
- applying each of the plurality of independent conditioning elements to the outer processing surface along the linear path.

17. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for conditioning the outer processing surface of the linear belt, as recited in claim 16, further comprising:

- distributing a plurality of spray nozzles along a linear path extending between a first edge and a second edge of the linear belt; and
- rinsing the outer preparation surface of the linear belt using each of the plurality of spray nozzles along the linear path.

18. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for conditioning the outer processing surface of the linear belt, as recited in claim 17, further comprising:

- distributing a plurality of thistle brushes along a linear path extending between a first edge and a second edge of the linear belt; and
- cleaning the outer preparation surface of the linear belt using each of the plurality of thistle brushes along the linear path.

19. In a chemical mechanical planarization (CMP) system, the CMP system having a first roller, a second roller, and a linear belt, the linear belt circulating around the first roller and the second roller, the linear belt having a width that spans between a first edge and a second edge, the linear belt having an outer processing surface and an inner surface, the method for conditioning the outer processing surface of the linear belt, as recited in claim 16, wherein the independent conditioning elements are configurable to apply a pressure against the outer preparation surface from about 0.1 PSI to about 2.0 PSI.

* * * * *